Figure 1:
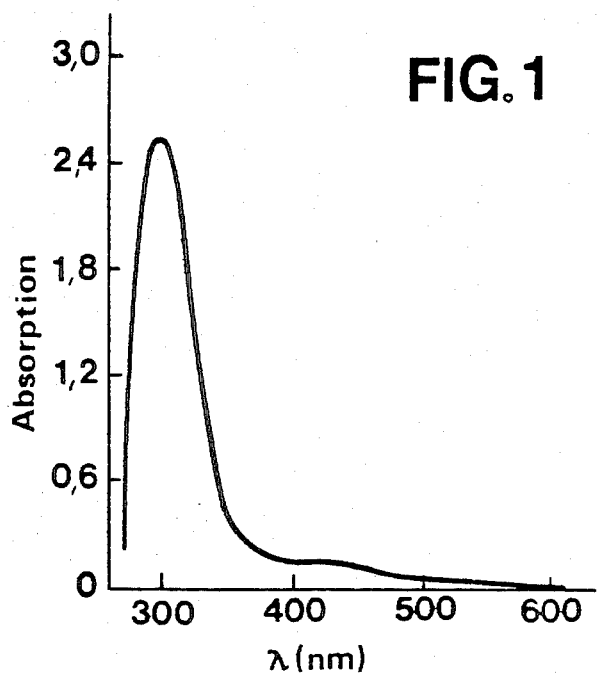

United States Patent [19]

Graetzel et al.

[11] Patent Number: 4,684,537

[45] Date of Patent: Aug. 4, 1987

[54] PROCESS FOR THE SENSITIZATION OF AN OXIDATION/REDUCTION PHOTOCATALYST, AND PHOTOCATALYST THUS OBTAINED

[75] Inventors: Michael Graetzel; Nick Serpone; Dung Duonghong, all of Lausanne, Switzerland

[73] Assignee: R. E. Stiftung, Zürich, Switzerland

[21] Appl. No.: 824,694

[22] PCT Filed: Apr. 30, 1985

[86] PCT No.: PCT/CH85/00066

§ 371 Date: Dec. 27, 1985

§ 102(e) Date: Dec. 27, 1985

[87] PCT Pub. No.: WO85/05119

PCT Pub. Date: Nov. 21, 1985

[30] Foreign Application Priority Data

Apr. 30, 1984 [CH] Switzerland ............... 2113/84

[51] Int. Cl.$^4$ ............................................. B05D 3/06
[52] U.S. Cl. ............................ 427/53.1; 204/157.5; 204/157.52; 427/54.1; 427/215
[58] Field of Search ............... 427/53.1, 54.1, 217, 427/215; 204/157.4, 157.41, 157.5, 157.52

[56] References Cited

U.S. PATENT DOCUMENTS 4,105,517  8/1978  Ryason ........................ 204/157.5

Primary Examiner—John H. Newsome
Attorney, Agent, or Firm—Pennie & Edmonds

[57] ABSTRACT

A photocatalyst for photodecomposition of liquids is sensitized to visible light by chemically bonding to the catalyst a complex of a transition metal with a bipyridyl or phenanthrolyl type ligand.

8 Claims, 2 Drawing Figures

PROCESS FOR THE SENSITIZATION OF AN OXIDATION/REDUCTION PHOTOCATALYST, AND PHOTOCATALYST THUS OBTAINED

The invention relates to a process for the sensitization of a semiconductor-based oxidation/reduction photocatalyst, to the photocatalyst thus obtained and also to the use of the said photocatalyst for the photooxidation of aqueous or aqueous-organic liquids or the photodecomposition of aqueous liquids in visible light. One of the purposes will be the photoproduction of hydrogen. The subject of the present invention is defined in the claims.

The immediate problem encountered with photoelectrochemical cells or with systems for the photochemical generation of hydrogen, especially systems based on solar energy conversion, is the efficiency of this energy conversion. A variety of solutions are currently being proposed to overcome this problem, such as modification of the surface of the photocatalyst with photoreactive dyes or doping of the said photocatalyst with suitable substances.

To solve the problems of the efficiency of solar energy conversion in applications such as the photodecomposition of aqueous liquids, it would be of interest to possess photocatalysts having a light absorption band in or near the visible region. It has been observed that, by forming a complex of titanium oxide ($TiO_2$) using a complex of titanium and 8-hydroxyquinoline, it is possible to sensitize the particles of titanium oxide so as to enable them to be used in visible light [see in this connection J. Am. Chem. Soc. 105, 5695 (1983)]. However, the use of this type of photocatalyst is restricted by the fact that it is not possible to produce oxygen by the photodecomposition of water.

The object of the present invention is to purpose a sensitized photocatalyst which makes it possible to generate hydrogen and oxygen, with a satisfactory efficiency, by the photodecomposition of aqueous liquids in visible light. This is achieved by sensitizing a semiconductor-based oxidation/reduction photocatalyst by means of the process claimed.

It has in fact been discovered, surprisingly, that the desired effect is achieved by fixing to the surface of a semiconductor-based oxidation/reduction photocatalyst, such as titanium oxide, for example, a chromophore consisting of a fragment of a complex of a transition metal with a ligand of the bipyridyl or phenanthrolyl type.

According to the invention, the said chromophore most generally consists of a fragment of a ruthenium, chromium or iron complex, preferably a complex fragment of the formula:

$RuL_2^{++}$ in which the symbol L represents the ligand diisopropyl 2,2'-bipyridyl-4,4'-dicarboxylate. A chromophore of this type is perfectly stable under the conditions of use of the photocatalyst and causes the light absorption of the photocatalyst to shift beyond 600 nm. The stability of such as chromophore can be explained by the chemical fixation of the complex fragment:

$RuL_2^{++}$ to the surface of the particles of titanium oxide, more precisely by the formation of Ru-O-Ti bonds as illustrated below:

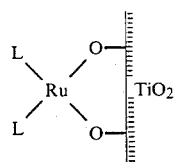

(L=diisopropyl 2,2'-bipyridyl-4,4'-dicarboxylate).

It has been found that a photocatalyst sensitized in this way makes it possible to obtain hydrogen, with a satisfactory efficiency, by irradiating aqueous or aqueous-organic liquids at a wavelength of between 590 and 665 nm. The photodecomposition of water to give hydrogen and oxygen respectively has been carried out just as efficiently.

According to the invention, the photocatalyst is sensitized by fixing the chosen chromophore to the surface of the semiconductor by any suitable method. In a preferred method of carrying out the process of the invention, the photocatalyst is irradiated in the presence of an acid aqueous solution of a complex of the formula:

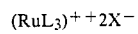
$(RuL_3)^{++} 2X^-$ in which L is defined as above and X represents a halogen atom such as, for example, chlorine.

The $TiO_2$-based oxidation/reduction catalyst can advantageously be prepared by the methods described in the literature; the solution of the complex defined above can be obtained from commercial products.

For the irradiation, the chosen quantity of catalyst is suspended in a dilute aqueous solution of complex, which is of the order of 0.5 to $5 \times 10^{-4}$ molar according to the particular case. If necessary, the pH of the solution is adjusted to the prescribed value, which is generally between 1 and 3, by the addition of acid. The process is preferably carried out at a pH of about 2 for a complex concentration of about $1.5 \times 10^{-4}$ molar. Before actual irradiation, the equipment is degassed, for example with an inert gas such as argon. The suspension prepared in this way is then heated to the chosen temperature, which is most generally between 50° C. and the boiling point; an operating temperature of about 100° C. is preferred. Irradiation is performed by conventional means, such as a UV lamp commonly used in the laboratory; it is continued for the time required for virtually all the complex initially dissolved to disappear, which generally takes 24 hours or more.

The photocatalyst sensitized in this way is then collected, for example by filtration or ultracentrifugation, purified and finally dried by the customary techniques. Experience has shown that this type of photocatalyst remains stable and active, under the conditions of its use, even for periods of several weeks.

Figure 2:
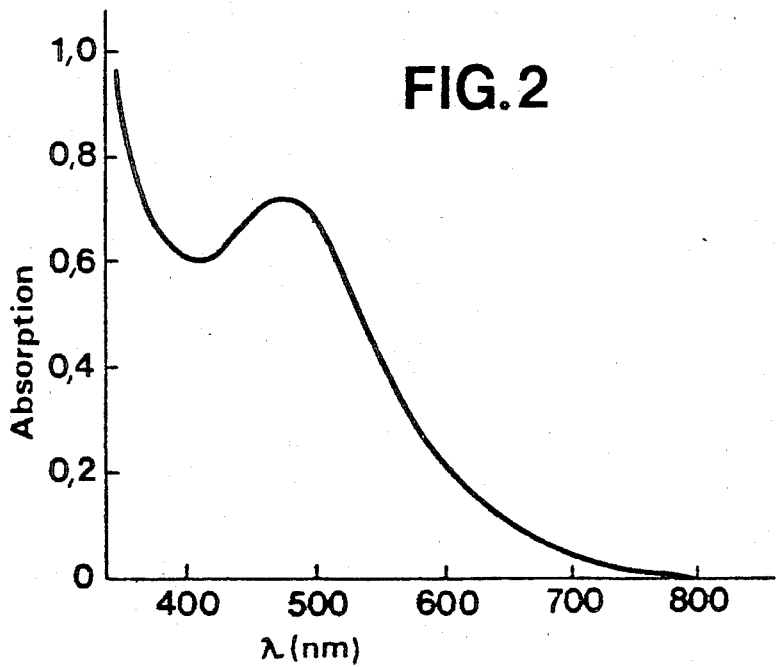

FIGS. 1 and 2 of the drawing represent absorption spectra of the treated photocatalysts.

According to the invention, a sensitized photocatalyst of this type can advantageously be used to generate hydrogen gas by the irradiation of aqueous liquids in visible light. This can be done, for example, by carrying out the photooxidation of an aqueous-organic liquid, such as a dilute aqueous solution of triethanolamine, for example, the organic compound present acting as a sacrificed electron donor.

This type of catalyst can be used just as advantageously for the photodecomposition of aqueous liquids, for example distilled water, to give oxygen and hydrogen respectively, by irradiation in visible light.

In the cases mentioned above, irradiation can advantageously be performed using light with a wavelength greater than 400 nm, for example of the order of 450 nm, or even 500 nm or more. In addition, the said irradiation most generally takes place at the boiling point of the chosen aqueous liquid, for example in equipment similar to that used for sensitizing the photocatalyst.

The examples which follow will illustrate in greater detail some of the methods of carrying out the invention. The said examples in no way imply a limitation (temperatures are indicated in degrees centigrade).

EXAMPLE 1

Sensitization of an oxidation/reduction catalyst based on titanium oxide (a) Preparation of the catalyst ($TiO_2/Pt/RuO_2$)

Starting materials:
($RuL_3$)$Cl_2$ (L=diisopropyl 2,2'-bipyridyl-4,4'-dicarboxylate) prepared according to J. Am. Chem. Soc. 105, 5695 (1983)
$TiO_2$ (anatase; Nb content about 600 ppm; size of the primary crystals 100 A; BET 145 $m^2/g$)
$TiCl_4$ purified by vacuum distillation according to J. Am. Chem. Soc. 105, 6547 (1983)

The first step was to hydrolyze a quantity of $TiCl_4$ in water at 0°, in the presence of a quantity of $NbCl_2$ calculated to give a doping level of 0.1% of Nb. The hydrolyzed solution (pH 0.5) was then dialyzed until the pH reached 2.

$H_2PtCl_6$ and $RuO_4$ were then added respectively to the acid solution prepared in this way, the quantity added being calculated to give a content of 0.5% of Pt and $RuO_2$ respectively in the $TiO_2$ particles. The resulting solution was subsequently evaporated to dryness at 60° and the residue was kept for 24 hours at this temperature. At this stage in the operations, a spontaneous decomposition of $RuO_4$ to $RuO_2$ was observed (black deposits).

50 mg of the dry residue thus obtained were suspended in 25 ml of water and irradiated (xenon lamp XBO 450 Watt) after the suspension had first been degassed with argon. Reduction of the hexachloroplatinate anions was carried out according to the method described in J. Am. Chem. Soc. 100, 4318 (1978), irradiation being stopped after about 30 minutes as soon as hydrogen appeared in the gas phase.

(b) Sensitization of the catalyst ($TiO_2/Pt/RuO_2$)

The ruthenium complex ($RuL_3$)$Cl_2$ was added to the suspension of catalyst (50 mg) obtained in section a, diluted to 40 ml, the quantity added being calculated to give a concentration of the said complex of $1.5 \times 10^{-4}$ molar, and the pH of the suspension being adjusted to 2 with HCl.

A 50 ml round-bottomed flask containing the resulting suspension was then connected to an apparatus fitted with a condenser, which was itself joined via a capillary tube to a second vessel containing 30 ml of water, the entire system then being degassed with argon. The suspension was subsequently heated to the boil, with continuous stirring, and irradiated with a xenon lamp (XBO 450 Watt) fitted with a UV filter (420 nm) and a double wall containing circulating water.

Irradiation of the suspension was maintained for 24 hours at the boiling point and the particles of sensitized catalyst were recovered by ultracentrifugation. During irradiation, the complex ($RuL_3$)$Cl_2$ gradually disappeared from the solution, this phenomenon being accompanied by intense coloration of the particles of $TiO_2/Pt/RuO_2$. The resulting solution was characterized by its UV absorption spectrum (see FIG. 1), which confirms the virtually complete disappearance of the absorption typical of the complex ($RuL_3$)$Cl_2$ at 466 nm (concentration below 5%). The absorption maximum of the said solution at 305 nm was attributed to the ligand diisopropyl 2,2'-bipyridyl-4,4'-dicarboxylate.

The fixation of the chromophore $RuL_2^{++}$ was tested by means of successive washings of the particles with $H_2O$ and methanol.

In a second experiment, irradiation of a suspension of 25 mg of $TiO_2/Pt/RuO_2$ catalyst in 40 ml of water (pH 2) was maintained for 36 hours at 100° C. The particles of sensitized catalyst were then filtered off, washed with $H_2o$ and dried in air, and the catalyst purified in this way was characterized by its reflection spectrum (FIG. 2). This spectrum is characterized by an absorption maximum at 480 nm followed by a tail extending beyond 600 nm. This characteristic absorption was attributed to the chromophore $RuL_2^{++}$ chemically bonded to the $TiO_2$ particles as illustrated above.

EXAMPLE 2

Use of a sensitized oxidation/reduction catalyst for the photoreduction of water 5 ml of a $10^{-2}$ molar solution of triethanolamine in water (pH 10) were irradiated at 25° in an apparatus such as that described in Example 1, in the presence of 10 mg of $TiO_2/Pt/RuO_2$ catalyst sensitized with $RuL_2^{++}$: irradiation at λ greater than 405 nm—xenon lamp XBO 450 Watt (intensity 200 mW/$cm^2$). Hydrogen gas was thus generated at a rate of 0.93 ml/hour.

A 20% drop in the yield of hydrogen gas was observed when using a 465 nm UV filter. When irradiating at λ greater than 590 nm, the hydrogen gas was generated at a rate of 50 μl/hour.

EXAMPLE 3

Use of a sensitized oxidation/reduction catalyst for the photodecomposition of water A suspension of 50 mg of $TiO_2/Pt/RuO_2$ catalyst sensitized with $RuL_2^{++}$ in 40 ml of water (pH 2) was irradiated at 100° in an apparatus such as that described in Example 1: λ greater than 420 nm. Hydrogen gas was initially generated at a rate of 30 μl/hour, giving a volume of 400 μl after 20 hours of irradiation.

Chromatographic analysis of the gas during irradiation (400 μl sample taken after 12 hours) showed that there was a gaseous $H_2/O_2$ mixture in a virtually stoichiometric ratio: 240 μl (±20) of $H_2$ and 120 μl (±10) of $O_2$, the remainder being attributed to the correction due to the presence of air.

It was also observed that the sensitized catalyst remained active after having been irradiated for more than 2 weeks at 100° under conditions such as those described above.

What is claimed is:
1. A process for the sensitization of a titanium oxide-based oxidation/reduction photocatalyst, which comprises chemically bonding to its surface a chromophore consisting of a fragment of a complex of a transition metal with a ligand of the bipyridyl or phenanthrolyl type, causing the light absorption band of the catalyst to shift into the visible region.

2. The process as claimed in claim 1, wherein the chromophore consists of a fragment of a ruthenium, chromium or iron complex.

3. The process as claimed in one of claims 1 or 2 wherein the said chromophore consists of a complex fragment of the formula:

$$RuL_2^{++}$$

in which the symbol L represents the ligand diisopropyl 2,2′-bipyridyl-4,4′dicarboxylate.

4. The process as claimed in claim 3, wherein the photocatalyst is irradiated in the presence of an acid aqueous solution of a complex of the formula:

$$(RuL_3)^{++} 2X^-$$

in which the symbol L is defined in claim 6 and X represents a halogen atom.

5. The process as claimed in claim 4, wherein irradiation is carried out at a temperature of between 50° C. and the boiling point of the solution of complex and wherein the said solution has a pH of between 1 and 3.

6. A process for the sensitization of a semiconductor-based oxidation/reduction photocatalyst, which comprises chemically bonding to its surface a chromophore consisting of a fragment of a complex of a transition metal with a ligand of the bipyridyl or phenanthrolyl type, causing the light absorption band of the catalyst to shift into the visible region.

7. A process for the sensitization of a titanium oxide-based oxidation/reduction photocatalyst which comprises chemically bonding to its surface a chromophore consisting of a fragment selected from the group consisting of ruthium, chromium and iron complexes with the ligand diisopropyl 2,2′-bipyridyl-4,4′-dicarboxylate, causing the light absorption band of the catalyst to shift into the visible region.

8. The process as claimed in claim 4 wherein said chromophore is the product of a reaction involving the loss of at least one ligand from said complex of the formula:

$$RuL_3^{++}$$

* * * * *